United States Patent [19]

Saitoh et al.

[11] Patent Number: 4,867,297
[45] Date of Patent: Sep. 19, 1989

[54] BOARD EXCHANGING APPARATUS

[75] Inventors: Kunio Saitoh, Yokohama; Tamio Ohtani, Hadano; Yasuhiko Kanaya, Machida, all of Japan

[73] Assignee: Hitachi Seiko, Ltd., Tokyo, Japan

[21] Appl. No.: 83,279

[22] Filed: Aug. 10, 1987

[30] Foreign Application Priority Data

Aug. 11, 1986 [JP] Japan .................... 61-186815
May 25, 1987 [JP] Japan .................... 62-125903

[51] Int. Cl.⁴ ............................. B65G 47/00
[52] U.S. Cl. .................. 198/346.2; 198/347
[58] Field of Search ............ 198/347, 346.2, 339.1; 414/222

[56] References Cited

U.S. PATENT DOCUMENTS

| | | | |
|---|---|---|---|
| 4,141,458 | 2/1979 | Brooks et al. | 198/752 X |
| 4,534,695 | 8/1985 | Stump et al. | 414/749 |
| 4,621,967 | 11/1986 | Masada | 414/225 |
| 4,637,118 | 1/1987 | Sugiyama et al. | 414/222 X |
| 4,690,342 | 9/1987 | Langen | 198/347 X |
| 4,712,963 | 12/1987 | Kondo | 414/222 |

FOREIGN PATENT DOCUMENTS 60-259351 12/1985 Japan.
61-284353 12/1986 Japan.

Primary Examiner—Robert J. Spar
Assistant Examiner—Cheryl L. Gastineau
Attorney, Agent, or Firm—Antonelli, Terry & Wands

[57] ABSTRACT

A board exchanging apparatus comprising a first transfer device for transferring boards along a transferring path connecting a processing device and a feeder between the feeder and the transferring path, a second transfer device for moving a liftable board holding member along the transferring path and conveying the boards, a waiting device including liftable comb-like holding members superimposed in top and bottom relation and disposed at a location opposite to the processing device, a third transfer device for transferring the boards between the processing device and the waiting device, and a delivery device provded in the processing device.

7 Claims, 9 Drawing Sheets

BOARD EXCHANGING APPARATUS

BACKGROUND OF THE INVENTION

The present invention relates to a board exchanging apparatus associated with a board processing machine such as a printed board perforator.

In conventional board processing machines for drilling a printed board, it is known to automatically exchange the board by means of, for example, an apparatus such as disclosed in Japanese Patent Laid-open Application (Kokai) No. 259351/60.

In such a prior apparatus, when it is intended to exchange the board, the finished board on the processing machine has to be returned to a magazine prior to drawing of a new one to be processed from the magazine and, then supplying it into the processing machine.

This causes a problem to the board processing machine, resulting in delay of working time and decrease in the rate of operation.

SUMMARY OF THE INVENTION

Accordingly, in view of the foregoing problems, it is an object of the present invention to provide a board exchanging apparatus which enables an improved working ratio of the processing machine.

In order to achieve the above object, according to the present invention there is provided an apparatus comprising a first transfer device for transferring boards between a feeder and a transferring path, a second transfer device for moving a liftable board holding member along the feeder and the processing device, a waiting device including holding members superimposed in top and bottom relation and disposed at a location opposite to the processing device, a third transfer device for transferring the boards between the waiting device and the processing device, and a delivery device including a guide member which is liftable from the received position in the table of the processing device to a position at the same level as said holding members.

Further, according to the present invention, a next board to be processed is discharged from the feeder during the processing of the preceding board. The new board has been previously set on the holding members of the waiting means. After completion of the processing, the guide members rises to the same level as the bottom holding members of the waiting means to push the finished board up from the table. The board is then displaced by way of the third transfer means from the guide member to the bottom holding members. And, when the guide member continues to rise and arrives at the same level as the top holding members, the board previously put on the holding members is supplied to the guide means by means of the third transfer means. Then the guide means falls to place the board on the table, so that the processing device starts its working. In the meantime the finished board is conveyed toward the feeder by the board holding means to return it into the feeder through the first transfer means.

In this manner, the return of the finished board from the waiting means to the feeder and the storing of the new board in the waiting means supplied from the feeder can be carried out during the processing of the board, thereby reducing the time required for exchanging the board to the processing device and improving the working ratio for the processing device.

DESCRIPTION OF THE PREFERRED EMBODIMENTS

Preferred embodiments according to the present invention will be fully described hereinafter with reference to FIGS. 1 to 6.

Figure 1:
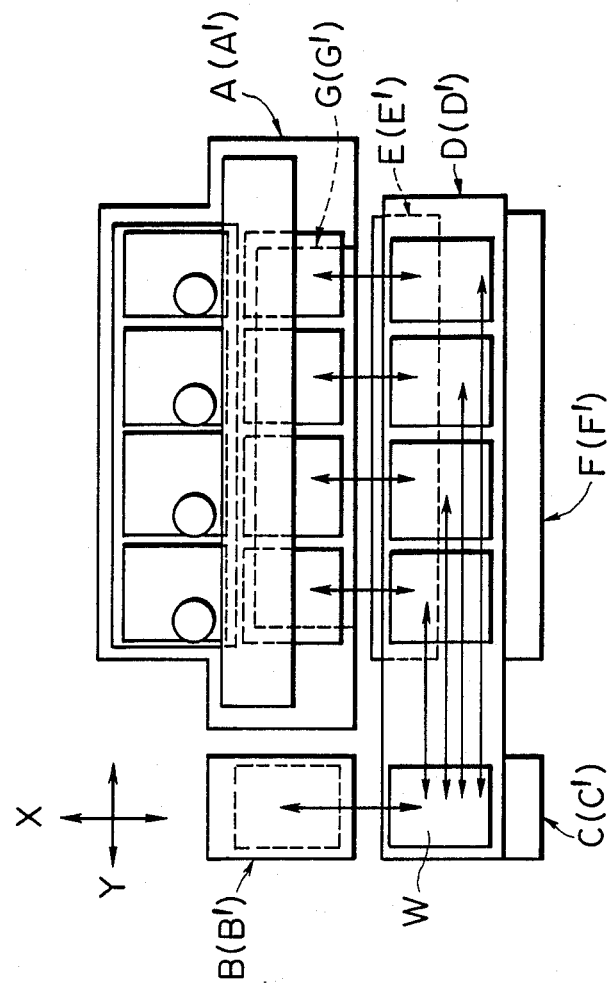
FIG. 1 is a plan view showing an arrangement between a board exchanging apparatus according to the present invention and a number of associated processing devices.

FIG. 1 shows a processing device A, a feeder B for feeding boards W, a first transfer device C situated opposite to the feeder B, a second transfer device D disposed along the processing device A and the feeder B, a waiting device E extending parallel to the second transfer device D, a third transfer device F facing toward the processing device A with the waiting device E interposed therebetween, and a delivery device G incorporated in the processing device A.

Figure 2:
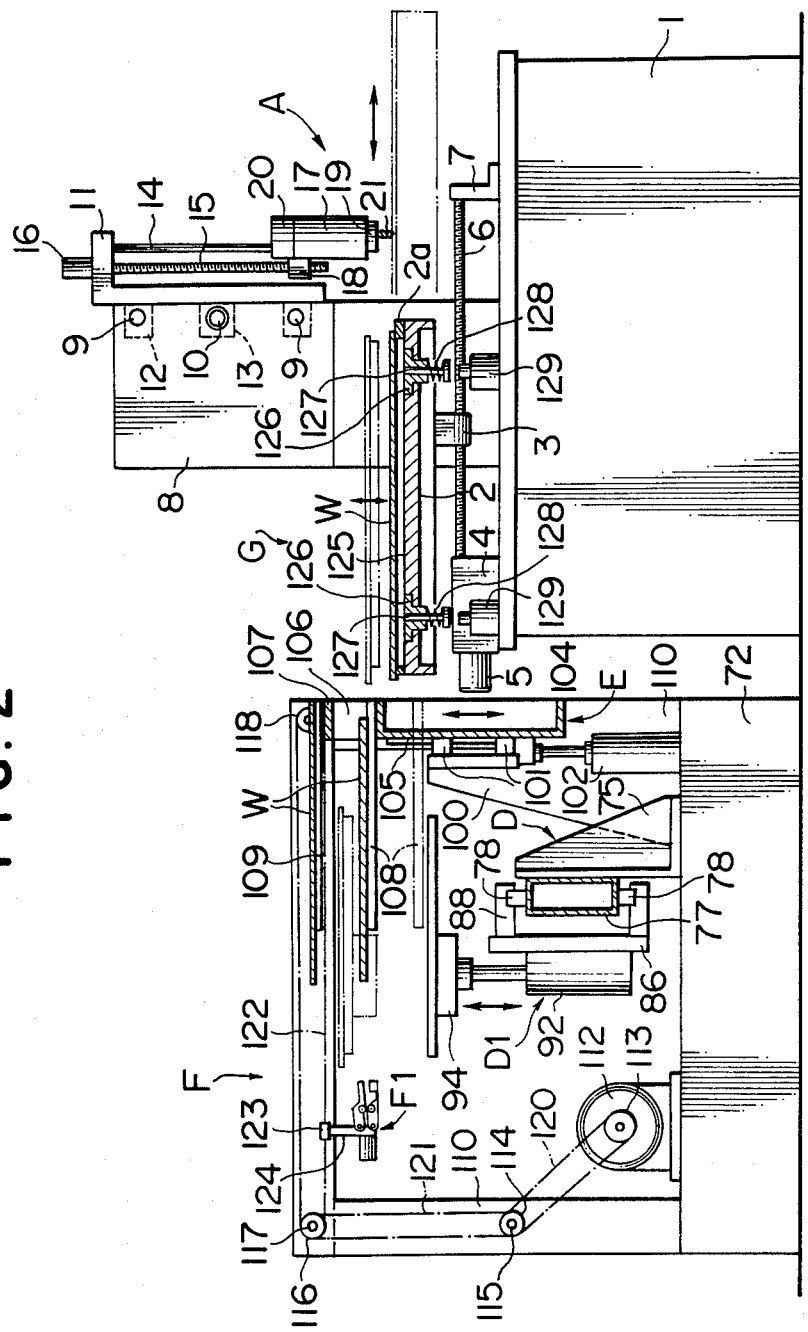
FIG. 2 is a partially cross-sectional side view of the board exchanging apparatus according to the present invention at the side of the processing device.

The above-mentioned processing device A may be arranged as shown in FIG. 2.

In the processing machine A shown, a reference numeral 1 shows a bed, and 2 is a table with a sub-table 2a mounted thereon which is slidably supported on the bed 1 by guide means not shown and includes a nut 3 extending below the lower surface of the table 2. A gear box 4 is fixed on the bed 1, and a motor 5 is attached to the gear box 4. A reference 6 designates a feed screw one end of which is connected to the output shaft of the gear box 4 and the other end is rotatably supported by a bracket 7 secured on the bed 1. A portal column 8 is provided on the bed 1 and striding over the table 2. Guide bars 9 are held by the column 8, and a feed screw 10 is rotatably supported on the column 8 and rotationally driven by a motor not shown. A saddle 11 includes bearings 12 slidably fitted on the guide bars 9 and a nut 13 whose threads are engaged with the threads of the feed screw 10. A guide bar 14 is held by the saddle 11. A feed screw 15 is rotatably supported by the saddle 11 and rotationally driven by a motor 16 attached on the saddle 11. A main shaft head 17 includes a bearing (not shown) slidably fitted on the guide bar 14 and a nut 18 whose threads are engaged with the threads of the feed screw 15. A spindle is rotatably supported by the main shaft head 17 and rotationally driven by the motor mounted on the main shaft head 17. A drill 21 is detachably held by a collet chuck (not shown) which is equipped for the spindle 19.

According to the foregoing arrangement, the table 2 is moved in a direction X along the feed screw 6 while the saddle 11 is moved in a direction Y along the feed screw 10 so that positioning between the board W set on the table 2 and the drill 21 are properly performed in the X-Y directions. The main shaft head 17 is then advanced along the feed screw 15 to drill the board W with the drill 21.

Figure 3:
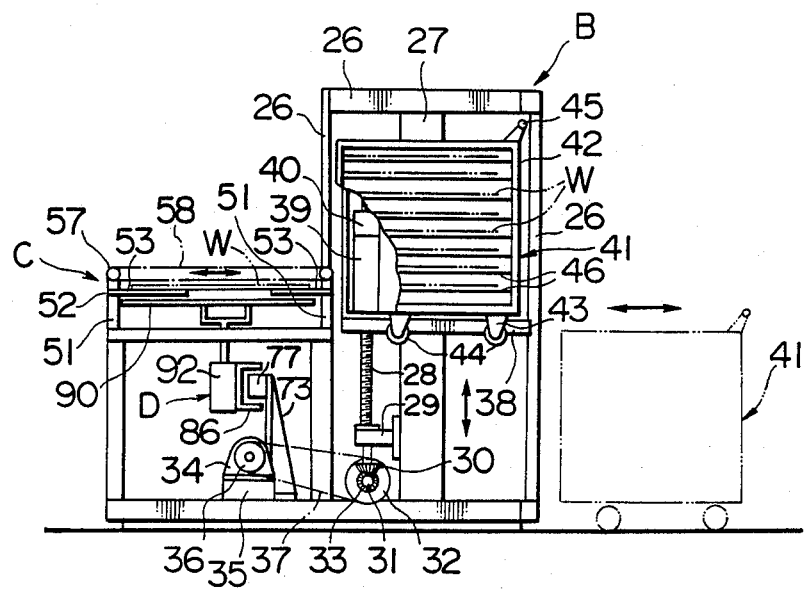
FIG. 3 is a partially cross-sectional side view of the board exchanging apparatus according to the present invention at the side of a feeder.

The above feeder B may be arranged as shown in FIG. 3.

In this feeder B schematically illustrated, the reference numeral 26 designates a casing, and 27 is a rail securely fixed within casing 26. A feed screw 28 is rotatably supported by the rail 27 through a bracket 29. A bevel gear 30 is fixed on one end of the feed screw 28. A shaft 31 is rotatably supported by the casing 26 for fixing thereon a pulley 32 and a bevel gear 33 engaging with the bevel gear 30. A motor 34 is carried on by a stand 35 disposed in the casing 26, and whose rotating shaft includes a pulley 36 fixed thereon. A belt 37 extends between the pulleys 32 and 36. A lifter 38 has a bracket 39 at one end and a nut 40 connected to this bracket, whose threads are engaged with the threads of the feed screw 28. A magazine 41 of cartridge type includes wheels 44 at the lower surface of its framework 42 through bearings 43 and a handle 45 at the upper end of the same. Shelves 46 are formed in spaced relation within the framework 42.

In this arrangement, the lifter 38 takes the magazine 41 into and out of the casing 26 when it is in the lowermost descended position of the casing.

Further the operation of the motor 34 moves the lifter 38 upward and downward so that the respective shelves 46 within the magazine 41 are selectively positioned at desired locations.

Figure 4:
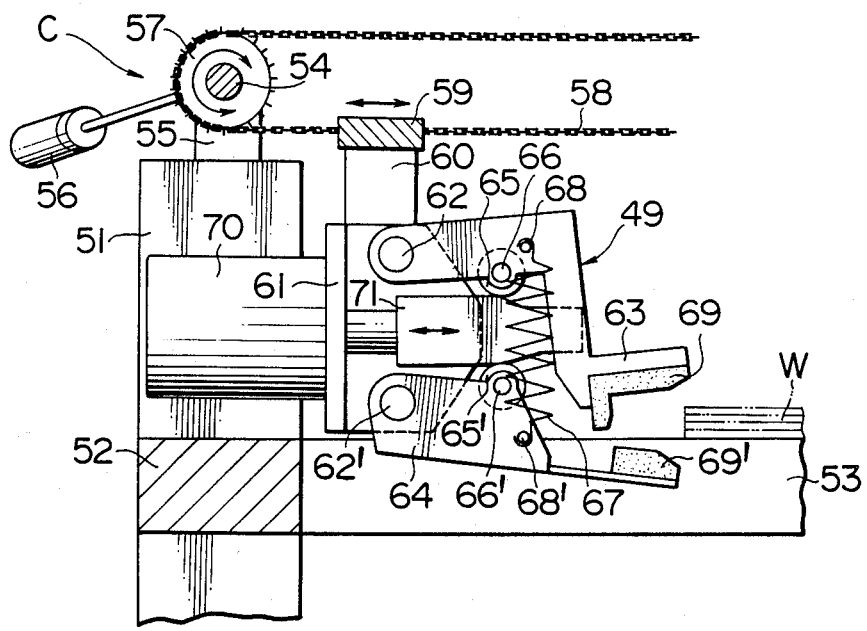
FIG. 4 is an enlarged partially cross-sectional view of a first transfer device.
Figure 5:
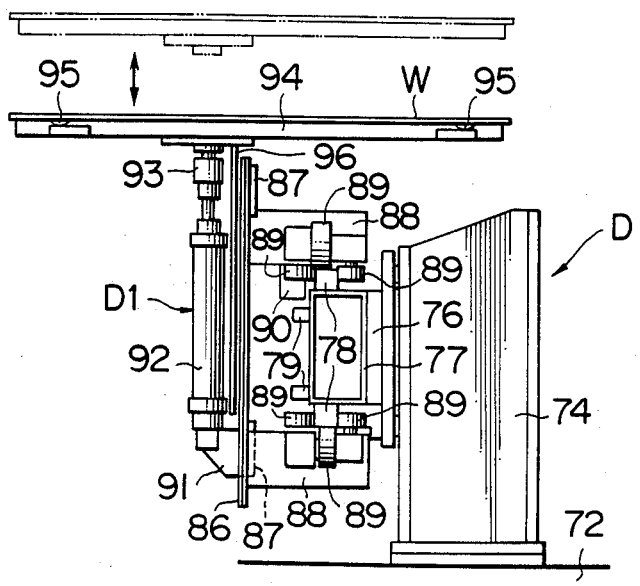
FIG. 5 is a side view of a second transfer device.
Figure 6:
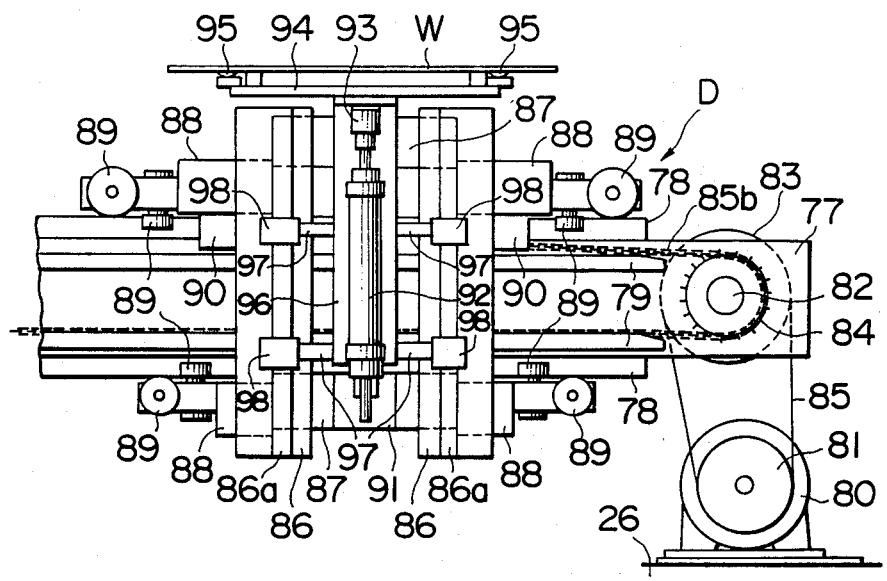
FIG. 6 is a front view of the second transfer device.

The above described first transfer device C may be arranged as shown in FIGS. 3 and 4.

In the illustrated first transfer device C, reference numerals 51 show columns extending upright from the casing 26. Crossbars 52 are connected between the columns 51. Receiving plates 53 oppositely protrude in a comb-like shape. Shafts 54 are rotatably supported by brackets 55 fixed on the columns 51. A motor 56 is supported by the casing. The rotational shaft of the motor is connected to one of the shafts 54. Sprockets 57 are securely fixed on the opposite ends of the shafts 54. Chains 58 are extended over the sprockets 57 and connected with each other by a beam 59 extending therebetween.

A chuck C1 is carried through a bracket 60 by the beam 59.

A base 61 for the chuck C1 is connected to the beam 59 through the bracket 60. Axles 62, 62' are provided on the base 61 projecting therefrom. An upper jaw 63 and a lower jaw 64 are rotatably supported by the axles 62, 62' respectively. Rollers 65, 65' are rotatably sustained by axles 66, 66' each of which are provided upstanding from the upper and lower jaws 63, 64. A spring 67 is extended between pins 68, 68' each mounted upright on the upper jaw 63 and the lower jaw 64 respectively. Chips 69, 69' are manufactured from a soft material such as plastic and attached on the distal ends of the upper and lower jaws 63 and 64. A cylinder 70 is connected to the base 61. A cam 71 is connected to the rod of the cylinder 70 to be located between the rollers 65, 65'.

In the above arrangement, when the motor 56 operates to rotate the sprockets 57 the chains 58 are moved. Thus the chuck C1 may approach or leave the feeder B.

Meanwhile, the actuation of the cylinder 70 permits the cam 71 to move between the rollers 65, 65' in order to open and close the distal ends of the upper and lower jaws 63, 64.

Accordingly, when the motor 56 is operated and moves the chuck C1 while it clamps the board W between the upper jaw 63 and the lower jaw 64, the boards may be transferred.

The above transfer device D may be arranged in such a manner as shown in FIGS. 2, 3, 5 and 6.

In the figures, a reference numeral 72 designates a base, and 73 is a pillar extending from the casing 26. Columns 74 and 75 are provided upright on the base 72. A bracket 76 is fixed on a surface at the side of the column 74. A girder 77 is fixed on the columns 73, 75 and the bracket 76. Rails 78 are mounted on both upper and lower surfaces of the girder 77. Chain guides 79 are connected to the side of the girder 77. A motor 80 is supported by the casing 26. A pulley 81 is attached on the rotational shaft of the motor 80. Axles 82 are rotatably mounted on the opposite ends of the girder 77. The pulley 83 and the sprocket 84 are installed on one of the axles 82, and the other axle (not shown) includes a sprocket (not shown) fixed thereon. A belt 85a is provided extending between the pulleys 81 and 83. A chain 85b extending between the sprocket 84 on one axle and the opposite sprocket mounted on the other axle is guided by the chain guides 79.

A carrier D1 is connected to this chain 85b.

Figure 8:
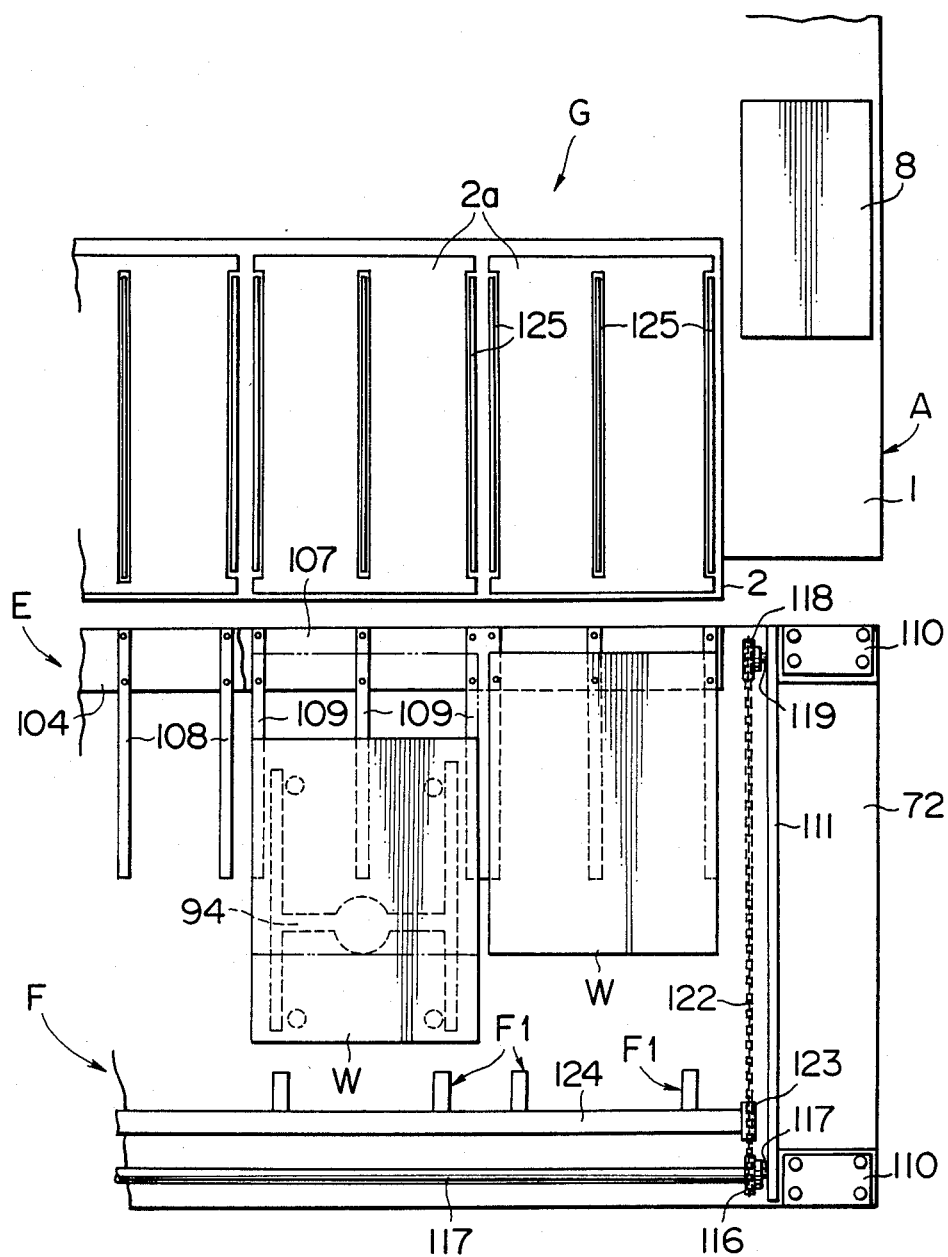
FIG. 8 is a plan view showing relation between the processing device, the waiting device and a third transfer device.

Guides 86 are provided with projections 86a for linear guidance formed at the center portions thereof. Girders 87 combine the guides 86 with each other at their upper and lower portions. Brackets 88 are connected to the guides 86. Three rollers 89 are rotatably supported to every two brackets 88 so as to make them contact with the rails 78 in three directions. Fixed on the brackets 88 are joints 90 to which the chain 85b is associated. A bracket 91 is fixed on the girder 87. Attached to the bracket 91 is a cylinder 92 whose piston rod is connected with the joint 93. A holder 94 is formed in an "H" shape such as shown in FIG. 8. Attraction pads 95 are carried by the holder 94 and communicated with a vacuum pressure supplying source (not shown). A guide 96 is fixed on the holder 94 and provided with arms 97. Bearings 98 are mounted at the ends of the respective arms 97 to slidably fit with the projections 86a.

With the above arrangement, when the motor 80 is actuated to move the chain 85b, the carrier D1 slides along the rails 78.

Further the operation of the cylinder 92 allows the holder to operate up and down.

Thus the carrier D1 can be shifted toward a desired position to transfer the board W there, while the board W rides on the holder 94 as it is attractively held by the pads 95.

Figure 7:
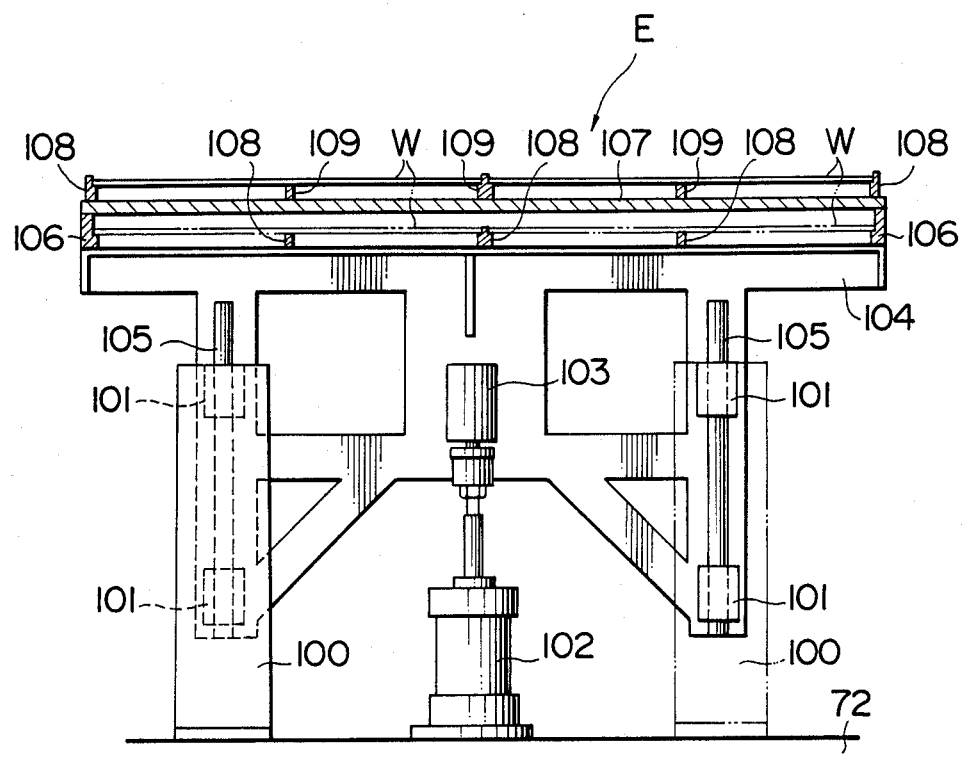
FIG. 7 is a rear view of a waiting device.

The above waiting device E may be arranged as shown in FIGS. 2, 7 and 8.

In the waiting device illustrated, the reference numerals 100 are columns upstanding from the base 72. Linear guide bearings 101 are fixed on the columns 100.

A cylinder 102 is provided upright on the base 72. At the distal end of the rod of the cylinder 102 a bracket 103 is connected. A frame 104 is associated with the bracket 103 and includes rails slidably fitted in the bearings 101. A spacer 106 is connected at both ends to the upper surface of the frame 104 for supporting a frame 107 on the spacer. Guides 108 are fixed on the frame 104 in spaced relation with one another so as to extend in a comb-like configuration toward a conveying path. Guides 109 are also fixed on the frame 104 in spaced relation with one another protruding toward the conveying path in a comb-like configuration.

In the above arrangement, the cylinder 102 operates to move the frame 104 upward and downward so that the guides 108 and 109 can be alternately shifted toward a delivery location for the boards W.

The third transfer device F may be arranged as shown in FIGS. 2 and 8.

In such figures, the reference numerals 110 are columns provided upstanding at the four corners of the base 72. Girders 111 are fixed on the upper portions of the columns 100. Fixed on the base 72 is a motor 112 whose rotational shaft is connected with a sprocket 113. Sprockets 114 are fixedly attached on the opposite ends of a shaft 115 rotatably supported by the columns 110. A shaft 117 which is rotatably supported between the columns includes sprockets 116 fixedly attached to both ends thereof. A sprocket 118 is securely fixed on an axle 119 rotatably supported by the column 110. A chain 120 extends between the sprockets 113 and 114. Also, a chain 121 is provided extending between the sprockets 114 and 116. Further a chain 122 extends communicating the sprocket 116 with the sprocket 118. A bracket 123 is attached on the chain 122. A bar 124 is connected to the bracket 123 and holds a chuck F1.

The chuck F1 is substantially identical in arrangement with the chuck C1 as illustrated in FIG. 4, and therefore, description regarding to the chuck F1 will be omitted.

With this arrangement, by the actuation of the motor 112 the chain 122 moves through the chains 120, 121 so that the board W clamped by the chuck F1 can be transferred.

The above delivery device G may be arranged as shown in FIGS. 2 and 8.

In the illustrated delivery device, the reference numerals 125 designate guides which are capable of going up and down within slots formed at the middle portion and notches at both sides of the sub-table 2a and, these guides 125 are so formed as to locate their upper surfaces at the same level as that of the sub-table 2a when they are descended. Bearings 126 are attached in place on the table 2 opposite to the guides 125. Axles 127 are connected at one end to the guides 125 and, extending slidably through the bearings 126, include at the other end a flange. A spring 128 is mounted around the axle 127 between the bearing 126 and the flange. A cylinder 129 is located on the bed 1 of the processing device A such that it corresponds with the flange of the axle when the table 2 shifts to the end position at the side of waiting device E.

In the above arrangement, when the table 2 occupies the shifting end position at the side of waiting device E the cylinder 129 actuates to push up the axle 127 through its piston rod. The guides 125 then rise up the board W is forced up to a delivering position.

On the contrary, when the cylinder 129 actuates to retract the piston rod each of the axles 127 is depressed by the biasing pressure of the spring 128 so that the guides 125 descend, thereby receiving the guides into the slots and notches of the sub-table 2a.

In the above arrangement, when the board W is put on the top guide 109 of the waiting device E and occupies the delivery position, the cylinder 102 actuates upon completion of the processing of the board W so that the frame 104 rises and the guide 108 shifts to the delivery position. At the same time, the table 2 moves toward the shifting end at the side of waiting device E by the operation of the motor 5.

Then the guides 125 rise by the actuation of the cylinder 129 to push the finished board W up to the delivery position.

Subsequently, the motor 112 actuates to move the chuck F1 of the third transfer device F toward the side of the processing device A. When the chuck F1 clamps the board W on the guides 125 the rotation of the motor 112 is reversed, so that the chuck can take the board out of the guides 125 to the guide 108. When the board W arrives at the upper portion of the guide 108, the chuck F1 releases the board W and retracts.

The cylinder 102 then actuates to lower the frame 104 and to move the top guide 109 to the delivery position.

Again the motor 112 actuates and the chuck F1 moves toward the side of the processing device. At this moment the chuck F1 clamps the board W placed on the guide 109 and forces the board W out of the upper portion of the guide 109 to the upper surface of the guide 125. When the board W arrives at a predetermined location on the guide 125 the chuck F1 releases the board W and the motor 112 rotates reversely. The chuck F1 is retracted accordingly.

After the chuck F1 has been moved backward, the cylinder 129 actuates and the piston rod descends. The guide 125 thus falls and puts the board W on the sub-table 2a.

In this manner the exchanging of the board W is completed and, the table 2 can shift to the processing position by the actuation the motor 5 so that the processing device A starts the processing of the board W.

In the meantime the cylinder 102 of the waiting device E operates for moving the bottom guide 108 to the delivery position. Then the motor 112 of the third transfer device F operates for moving the chuck F1 toward the side of the waiting device. And when the finished board W has been clamped by the chuck F1, the motor rotates reversely for taking the board W out of the guide 108 to a transferring position.

The term "transferring position" used herein means a position where the board W is put accurately and stably on the guide 108 (or 109) from where the second transfer device D can transfer the board W.

When the chuck F1 has been backed the motor 80 of the second transfer device D allows the carrier D1 to move toward the side of the waiting device E. Further when the holder 94 reaches below the board W existing at the nearest location the motor 80 stops for staying the carrier D1.

Then the cylinder 92 acts and the holder 94 ascends. The holder 94 forces up the board W to lift it above the guide 108. At this time vacuum pressure is supplied to the pads 95 to attractingly hold the board W by the pads 95.

After that, the motor 80 reverses its rotation permitting the carrier D1 to move toward a location opposite to the feeder B. When the carrier D1 halts, the vacuum pressure of the pads 95 is released and the pads 95 are communicated with atmospheric pressure.

Then the cylinder 92 operates the holder 94 to lower it to a position below the receiving plate 53 of the feeder B. In this manner the board is set on the receiving plate 53. In such a condition the motor 80 operates so that the carrier D1 shifts to the side of the waiting device E in order to ready transfer of a preceding board W.

Meanwhile the motor 56 of the first transfer device C actuates, and the chuck C1 is moved to a location where the upper jaw 63 and the lower jaw 64 will clamp the board W. The upper jaw 63 and the lower jaw 64 are pivoted by the actuation of the cylinder 70 for clamping the board W.

At that time, the actuation of the motor 56 allows the chuck C1 to move toward the side of the feeder B so that the board is pushed and inserted into the shelf of the magazine 42 in the feeder B.

And when the chuck C1 has arrived at the moving end of the side of feeder B, the cylinder 70 operates and the cam 71 is moved toward the side of the feeder B so that the upper jaw 63 and the lower jaw 64 open the mouth to release the board W. The chuck C1 then retracts by the actuation of the motor 56.

In the meantime the motor 34 of the feeder B actuates in such a way that the magazine 42 slides the shelves 46 at one step for receiving the next insertion of a board.

In this manner, all of the finished boards W are accommodated within the magazine 42.

Then the cylinder 102 of the waiting means E actuates and the guide 109 moves to the delivery position. Meanwhile the motor 34 of the feeder B is actuated for loading a new magazine to position a new board W to be processed. And the carrier D1 of the second transfer device D is waiting below the receiving plate 53.

The motor 56 of the first transfer device C actuates and moves the chuck C1 toward the side of the feeder B and, then, the action of the cylinder 70 permits a non-processed board W within the magazine 42 to be clamped with the chuck C1. When the motor 56 rotates reversely and the chuck C1 backs, the board W clamped by the chuck C1 is taken out of the shelf 46 to the upper surface of the receiving plate 53. The board W is released in place on the receiving plate 53 and the chuck C1 is further retracted alone.

The cylinder 92 of the second transfer device D operates and the holder 94 ascends to a location higher than that of the receiving plate 53. The holder 94 forces up the board W set on the receiving plate 53 to lift it above the receiving plate 53. At that time the vacuum pressure is supplied to the pads 95 so as to attractingly hold the board W.

The motor 80 of the second transfer device D operates the carrier D1 to be moved toward the side of the waiting device E. At this moment the holder 94 clamping the board W passes a course above the guide 109 of the waiting device E. When the holder 94 arrives at the furthest location within the transfer area covered thereby, the motor 80 stops and the carrier D1 is also stopped.

After that, the pads 95 are isolated from the vacuum pressure and communicate with the atmospheric pressure. Then the cylinder 92 operates for allowing the holder 94 to descend below the guide 108 of the waiting device E. According to that movement of the holder 94, the board W held on the holder 94 is displaced on the upper surface of the guide 109.

The carrier D1 then returns to the side of the feeder B while motor 80 of the second transfer device D operates.

Thus, the non-processed boards W are continuously transferred on a number of the guides 109 in the waiting device E.

Then the motor 112 of the third transfer device F acts and makes the chuck F1 shift toward the side of the waiting device E. The chuck F1 clamps the board W and transfers it from the transferring position to the waiting position at the side of processing device A.

When the motor 112 rotates reversely and the chuck F1 is retracted, this condition is maintained until the processing device A has completed the processing.

As has been described previously, since the exchanging of the board W between the feeder B and the waiting device E is made during the operation of the processing device, and since the exchanging of the board W to the processing device A is performed between the processing device A and the waiting device E, the time required for exchanging the boards W to the processing device A is conspicuously reduced and the working ratio of the processing device A is further improved.

Another embodiment according to the present invention will be fully described with reference to FIGS. 9 to 13.

In this embodiment, a processing device A', a feeder B' for feeding boards W, a first transfer device C', a second transfer device D', a waiting device E', a third transfer device F', and a delivery device G' are also arranged as shown in FIG. 1 and, therefore, relative arrangement between these devices is substantially identical with the case in the previous embodiment as illustrated in FIGS. 1 to 8.

Figure 9:
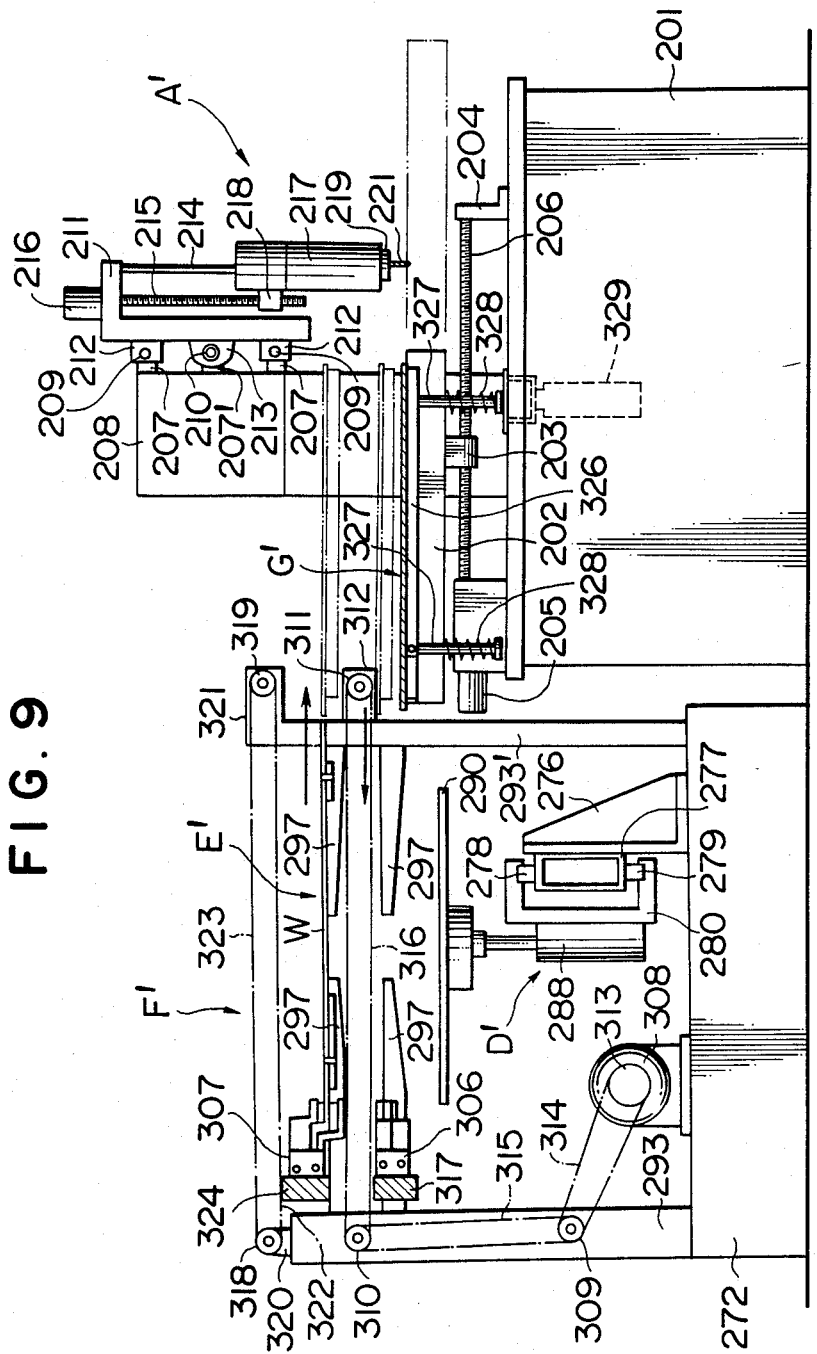
FIG. 9 is a partially cross-sectional side view of a board exchanging apparatus in accordance with another embodiment of the present invention.

In FIG. 9, a reference numeral 201 shows a bed, and 202 is a table slidably supported by guide means (not shown) fixed on the bed 201, and includes a nut 203 attached on the lower surface of the table 202. A feed screw 206 whose threads are engaged with the threads of the nut 203 is rotatably supported on the bed 201 by a bracket 204. A motor 205 drives the feed screw 206. A portal column 208 is provided on the bed 1. Guide bars 209 are attached in parallel on one side of the column 8 through a bracket 207. A feed screw 210 is rotatably supported at one side of the column 208 by a bracket 207' parallel to the guide bars 209 and rorationally driven by a motor not shown. A saddle 211 includes bearings 212 slidably fitted on the guide bars 209 and a nut 213 whose threads are engaged with the threads of the feed screw 210. A feed screw 215 is rotatably supported by the saddle 211. A motor 216 rotationally drives the feed screw 215. A guide bar 214 is held by the saddle 211 parallel to the feed screw 215. A main shaft head 217 includes a nut 218 whose threads are engaged with the threads of the feed screw 215 and a bearing (not shown) slidably fitted on the guide bar 214. A drill 221 is held by a spindle 219 which is rotatably equipped for the main shaft head 217.

According to the foregoing arrangement, the table 202 is moved in a direction X along the feed screw 206 while the saddle 211 is moved in a direction Y along the feed screw 210 so that positioning between the board W and the drill 211 are properly performed in the X-Y directions. The main shaft head 217 is then advanced in a direction Z along the feed screw 15 to carry out drilling.

Figure 10:
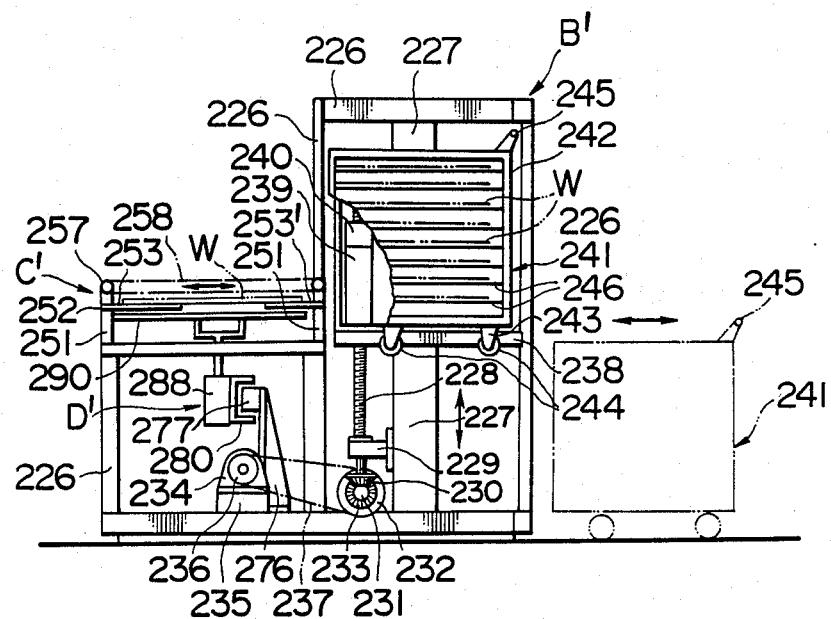
FIG. 10 is a partially cross-sectional side view of the board exchanging apparatus according to the present invention at the side of a feeder.

The feeder B' may be arranged as shown in FIG. 10. In this feeder B' schematically illustrated, the reference numeral 226 designates a casing, and 227 is a rail securely fixed on the casing. A feed screw 228 is rotatably supported by the rail 227 through a bracket 229. A bevel gear 230 is fixed on one end of the feed screw 228. A shaft 231 is rotatably supported by the casing 226 for fixing thereon a pulley 232 and a bevel gear 233 engaging with the bevel gear 230. A motor 234 is carried on a stand 235 disposed in the casing 226. The rotating shaft of the motor includes a pulley 236 fixed thereon. A belt 237 extends between the pulleys 232 and 236. A lifter 238 includes at one end a bracket 239 and a nut 240 connected to this bracket. The threads of the nut are engaged with the threads of the feed screw 228. A magazine 241 of cartridge type includes wheels 244 at the lower surface of its framework 242 mounted on bearings 243 and a handle 245 at the upper end of the same. Shelves 246 are formed in spaced relation within the framework 242.

In this arrangement, the lifter 238 takes the magazine 241 into and out of the casing 226 when it is descended to the lowermost position of the casing. Further the operation of the motor 234 can move the lifter 238 upward and downward.

Figure 11:
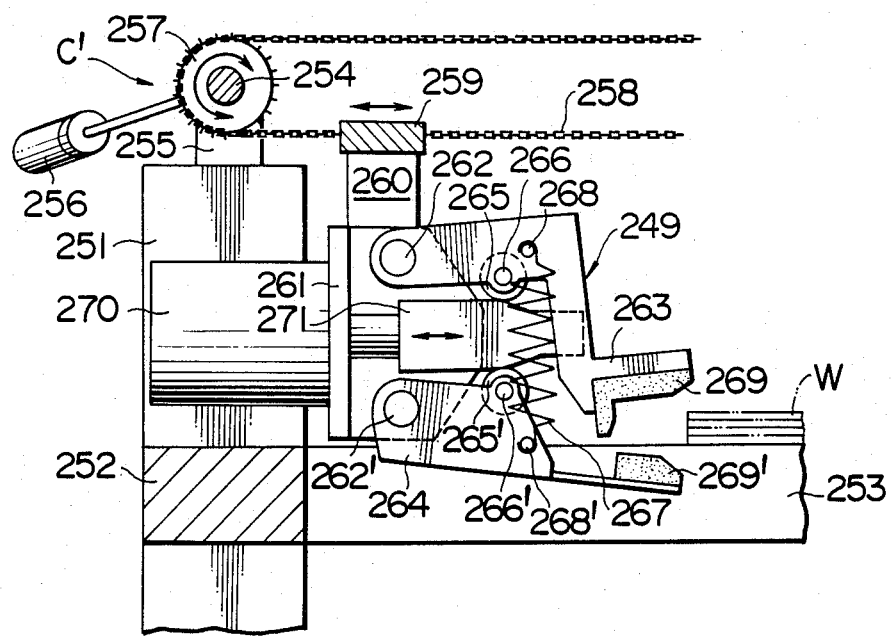
FIG. 11 is an enlarged partially cross-sectional view of a first transfer device.

The above described first transfer device C' which includes a chuck 249 for clamping the board W may be arranged as shown in FIGS. 10 and 11. The reference numerals 251 show columns extending upright from the casing 226. Crossbars 252 are connected between the columns 251. Receiving plates 253 oppositely protrude from the crossbars 252 in a comb-like shape. Shafts 254 are rotatably supported at the upper portion of the columns 251 through a bearing 255. A motor 256 drives the shafts 254. Sprockets 257 are securely fixed on the shafts 254. Chains 258 are extended over the sprockets 257. A beam 259 is connected with the chains 258. A supporting member 260 is connected to the beam 259. A base 261 is supported by the supporting member 260. Axles 262, 262' are provided on the base 261 projecting therefrom. An upper jaw 263 and a lower jaw 264 are rotatably supported by the axles 262, 262' respectively. Rollers 265, 265' are rotatably sustained by axles 266, 266' each of which are provided upstanding from the upper and lower jaws 263, 264. A spring 267 is extended between pins 268, 268' mounted upright on the upper jaw 263 and the lower jaw 264, respectively, in order to bias the upper and lower jaws 263, 264 in a direction for opening these jaws. Chips 269, 269' are of a soft material attached on the distal ends of the upper and lower jaws 263 and 264. A cylinder 270 is connected to the base 261. A cam 271 is connected at one of its ends to the piston rod of the cylinder 270 to be contacted with the rollers 265, 265'. Further, when the upper jaw 263 and the lower jaw 264 are closed the upper jaw 263 starts its movement earlier than the lower jaw 264.

According to these arrangement, the boards W are delivered from the shelves 246 of the magazine 241 to the receiving plate 253.

Figure 12:
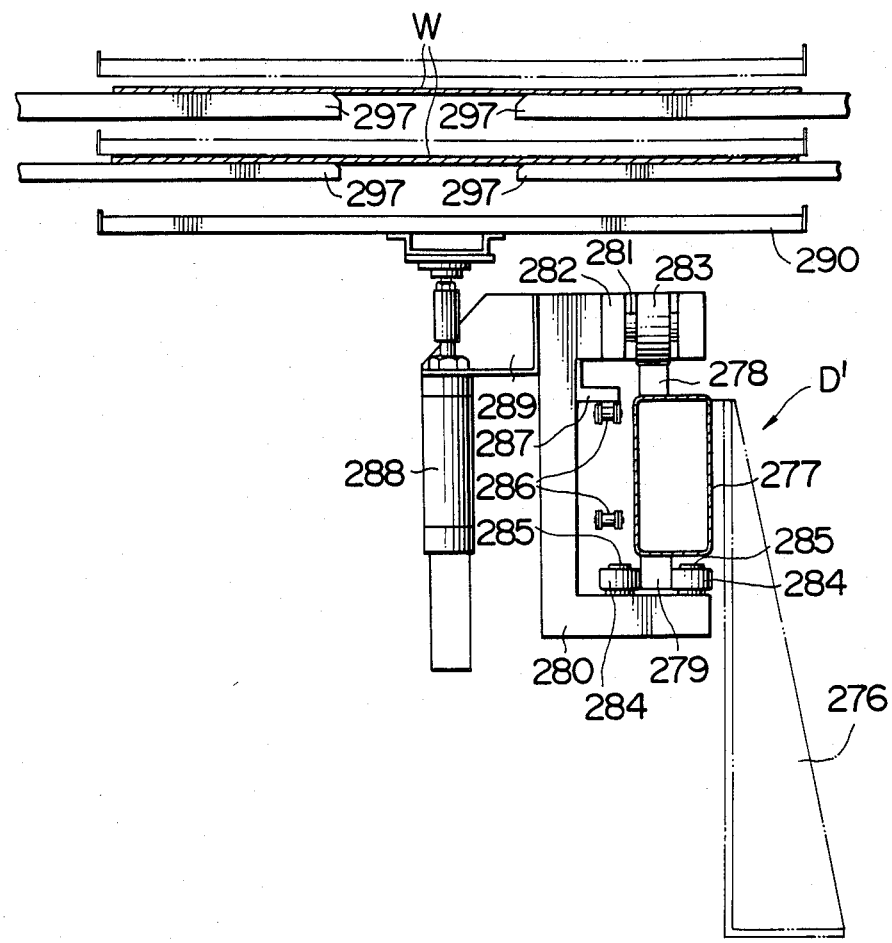
FIG. 12 is an enlarged view of a second transfer device.

The above transfer device D' may be arranged in the manner shown in FIGS. 9 and 12. A bracket 276 is provided on a base 272. A base girder 277 is supported by the bracket 276. Rails 278, 279 are fixed on the base 277. The numeral 280 shows a frame. An axle 281 is rotatably supported by bearing 282 provided in the frame 280. Fixed on the axle 281 is a wheel 283 which contacts the upper surface of the rail 278. A wheel 284 is rotatably supported by the axle 285 provided upstanding from the frame 280 and contacts with one side surface of the rail 279. A chain 286 is disposed parallel to the base girder 277 and allowed to reciprocate by drive means not shown. A bracket 287 connects the frame 280 with the chain 296. A three position cylinder 288 is attached on the frame 280 through a bracket 289. A receiving plate 290 is connected on the piston rod of the cylinder.

In such an arrangement, the frame 280 moves along the rails 278, 279 during the reciprocal movement of the chain 286. Then the cylinder 288 operates to make the receiving plate 290 ascend and descend, so that the delivery of the boards W can be realized.

Figure 13:
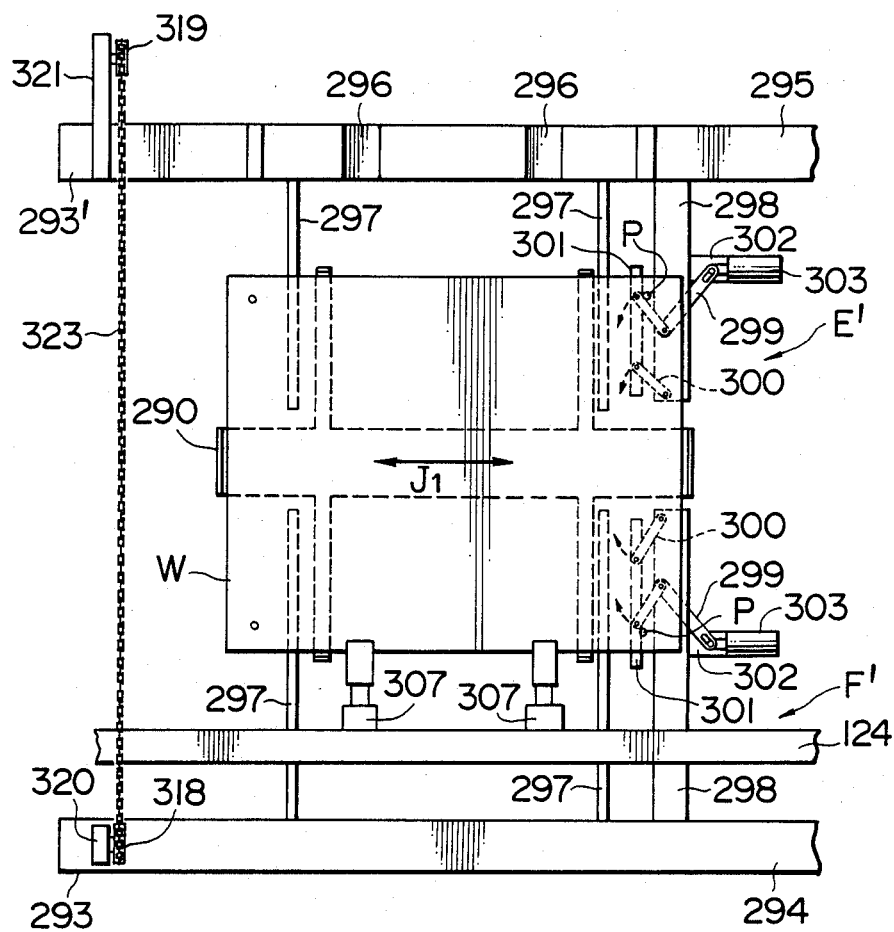
FIG. 13 is a plan view of a waiting device.

The waiting device may be arranged as shown in FIGS. 9 and 13. In the figures, the reference numerals 293, 293' designate columns upstanding from the base 272. Beams 294, 295 are provided connecting the columns 293 and 293'. Each beam 295 includes grooves 296 spaced at a predetermined distance between them. Further each of the beams 294, 295 are of two upper and lower beams disposed in parallel at a predetermined distance between them. Blades 297 are attached opposite to one another on the respective beams 294, 295 in predetermined, spaced relation. The beams 294, 295 each a positioning plate fixed thereon. Links 299, 300 are pivotably supported by the positioning plate 298. Push plates 301 are connected to the links 299, 300. Brackets 302 are fixed on the plates 298. Cylinders 303 are fixed on the brackets 302, the piston rod of each cylinder being coupled to one end of the link 299.

In the above arrangement, the board W is managed to be put on the blades 297. Positioning pins provided on the board W and upstanding therefrom will be clamped between the plate 298 and the push plate 301 to locate the board in a direction of an arrow J1.

The third transfer device F' includes chucks 306, 307 for clamping the board W and may be arranged such as shown in FIG. 9. Further, because the chucks 306, 307 have the same structure as the chuck 249 illustrated in FIG. 11, description for such chucks is omitted.

A motor 308 is fixed on the base 272. Sprockets 309, 310 are rotatably carried by the columns 293. A sprocket 311 is rotatably supported on the column 293' through a bracket 312. A sprocket 313 is fixed on the rotational shaft of a motor 308. Chains 314, 315, 316 extend respectively between the sprockets 313 and 309, the sprocket 309 and 310 and the sprockets 310 and 311. A beam 317 is connected to the chain 316 so as to carry the chuck 306.

Sprockets 318, 319 are rotatably supported through each of brackets 320, 321 by the column 293, 293', respectively. References 322 and 323 show chains. Connected to the chain 323 is a beam 324 which carries a chuck 307. Further the chains 322, 323 are driven by a motor not shown.

In the above arrangement, the chucks 306, 307 are so constructed as to move independently from each other.

The delivery device G' may be such arranged as shown in FIG. 9. Guides 326 are detachably fitted into grooves formed in the table 202. Slidably fitted on the table 202 are guide bars 327 whose one ends are connected to the guides 326. Springs 328 are mounted around the guide bars 327 to urge them downwardly from the table 202. A three position cylinder 329 is securely fixed on the bed 201 in such a manner that is confronts a guide bar 327 when the table 202 is in board exchanging position.

In the above arrangement, the cylinder 329 acts for lifting the guide 326.

According to the structure as described above, the receiving plate 290 of the second transfer device D' is shifted to a location opposite to the magazine 241 and waits below the receiving plates 253, as shown in FIG. 10. Then the motor 256 shown in FIG. 11 operates in such a manner that the chuck 249 moves into the magazine 241 and jaws 263, 264 fit on the board W put on the shelf 246 in order to clamp the board W with the jaws 263, 264. In such a condition the motor 256 actuates, and the chuck 249 is retracted. The chuck 249 thus takes the board W out of the magazine 241 to the receiving plates 253. But, the chuck 249 once stops at a predetermined location and the cylinder again acts for opening the jaws 263, 264 to release the board W and, then, the chuck 249 again moves while the jaws 263, 264 depart from the board W.

Further the cylinder 288 operates for raising the receiving plate 290 to the uppermost end position. The receiving plate 290 thus lifts the board W on the receiving plates 253 and accommodate it. In such a condition, the chain 286 moves and the receiving plate 290 is shifted toward the waiting device E'. At this time, the receiving plate 290 is in a level higher than the top blades 297. When the receiving plate 290 stops at a predetermined position, the cylinder 288 operates so that the receiving plate 290 descends to the lowermost end position. Thus the board W supported on the receiving plate 290 is displaced on the top blades 297. Then the receiving plate 290 returns to the side of the feeder B'.

In such a manner, the necessary boards are succeedingly transferred to the top blades 297 of the waiting device E'.

After the processing device A' has completed the processing of the board W the table 202 moves toward the side of the waiting device E' and then stops. The cylinder 329 forces the guide bars 327 to ascend the guides 326 to a location at the same level as the bottom blades 297 of the waiting device E'. In such a condition the motor 308 actuates for moving the chuck 306 toward the side of the table 202. The jaws are fitted on the board W forced up by the guides 327 and clamp this board W. The chuck 306 is then returned so that the chuck 306 takes the board W out of the guides 326 to the blades 297. After the chuck 306 has moved the board W to a predetermined position on the blades 297, it releases the board W and returns to the waiting position. The cylinder 329 operates for raising the guides 326 up to a location at the same level as the top blades 297 of the waiting device E'. The chuck 306 then moves and clamps the board W on the blades 297, so that the board W is displaced from the blades 297 to the guides 326. When the board W arrives at a predetermined location on the guides 326, the chuck stops and releases the board W and, then, returns. When the cylinder 329 retracts the piston rod the guides 326 descend by the function of the spring 328 to put on the table 202 the board W. The table 202 on which the board W rides on moves toward the processing location.

At the same time, the receiving plate 290 is shifted below the board W put on the blades 208. When the receiving plate 290 arrives at the middle position between the top and bottom blades 297 by means of the cylinder 297, the finished board W on the bottom blades 297 is pushed up. At this moment, the chain 286 moves and transfers the board W toward the side of the feeder B'. The receiving plate 290 is then lowered by the cylinder 288 so that the board W remains on the receiving plates 253. Under these conditions, the motor 256 actuates for fitting the jaws to clamp the board W by the actuation the cylinder 270, the chuck 249 is shifted toward the side of the magazine 241. The board W is thus accommodated from the receiving plates 253 into the shelf 246 of the magazine 241. The chuck 249 releases the boards and returns to the waiting position after the board W has been forcedly inserted into a predetermined position within the magazine 241.

Similarly, all of the finished boards W on the bottom blades 297 of the waiting device E' are restored in the magazine 241.

These operations are repeatedly performed to exchange the board W. In the exchanging operations, since the transferring of the boards W between the magazine 241 and the waiting device E' is made during the operation of the processing device A', and since the delivery of the board W between the blades 297 and the guides 326 is only performed when the processing device A' is out of operation, short time exchanging operation for the board W can be realized.

As has been described in the above, according to the present invention, the time required for exchanging the board to the processing device has been conspicuously reduced and the working ratio of the processing device has been further improved.

What is claimed is:

1. A board exchanging apparatus for exchanging boards between a board processing device with a table and a board feeder disposed in parallel to said board processing device, characterized in that said board exchanging apparatus comprises:

first transfer means including clamping means for clamping the board, said clamping means being moved between the feeder and a transferring path to transfer the boards;

second transfer means for transferring the boards including a guide member disposed along the board processing device and the board feeder, a shift member moving along said guide member, and a board holding member liftably supported by said shift member;

waiting means for temporarily holding boards to be supplied to and discharged from said board processing device, said waiting means including a plurality of projecting comb-like holding members which are disposed at a location opposite to the board processing device, said holding members being superimposed in upper and lower waiting positions, one of said waiting positions being adapted for temporarily holding a board to be supplied to said board processing device and the other waiting position being adapted for temporarily holding a board discharged from said board processing device;

third transfer means associated with said waiting means and including clamping means for clamping the boards held in said waiting positions, said clamping means being moved between a location above the table of the board processing device and the waiting means in order to transfer the boards to and from the table; and delivery means for delivering the boards between said waiting means and said board processing means, said delivery means including a guide means provided in said table of the board processing device for vertically lifting and lowering the board onto and from the table of the board processing device, said guide means being so associated with said waiting means that the guide means may selectively be in a level of one of said waiting positions to deliver or receive the board to or from the waiting position by way of said clamping means of the third transfer means.

2. A board exchanging apparatus according to claim 1 wherein said clamping means of said first transfer means comprises a chuck which is fixed on a chain and opened or closed by a cam.

3. A board exchanging apparatus according to claim 1 wherein said waiting means comprises a device for positioning the board on the holding members.

4. A board exchanging apparatus according to claim 1, including a first frame moved up and down by a cylinder, and a second frame provided on said first frame through a spacer, said holding members being mounted on these frames.

5. A board exchanging apparatus according to claim 1, wherein said holding members of the waiting means are vertically movable between said two waiting positions.

6. A board exchanging apparatus according to claim 1, wherein said guide means is adapted to move to the levels of said two waiting positions.

7. A board exchanging apparatus according to claim 1, wherein said board holding member of said second transfer means comprises vacuum attraction pads for attractively holding the boards transferred thereon.

* * * * *